United States Patent
Sakuma

(10) Patent No.: US 9,190,470 B2
(45) Date of Patent: Nov. 17, 2015

(54) SEMICONDUCTOR DEVICE WHICH SUPPRESSES FLUCTUATIONS IN BREAKDOWN VOLTAGE

(71) Applicant: SEIKO EPSON CORPORATION, Tokyo (JP)

(72) Inventor: Shigeyuki Sakuma, Sakata (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/533,647

(22) Filed: Nov. 5, 2014

(65) Prior Publication Data
US 2015/0123237 A1   May 7, 2015

(30) Foreign Application Priority Data

Nov. 6, 2013  (JP) ................................. 2013-229972

(51) Int. Cl.
| | | |
|---|---|---|
| *H01L 29/861* | (2006.01) | |
| *H01L 29/06* | (2006.01) | |
| *H01L 29/66* | (2006.01) | |
| *H01L 29/866* | (2006.01) | |

(52) U.S. Cl.
CPC ........ *H01L 29/0649* (2013.01); *H01L 29/0615* (2013.01); *H01L 29/66106* (2013.01); *H01L 29/866* (2013.01)

(58) Field of Classification Search
CPC ............ H01L 29/8611; H01L 29/0619; H01L 29/0649; H01L 29/66106; H01L 29/0615; H01L 29/866
USPC ........................................................ 257/494
See application file for complete search history.

(56) References Cited

U.S. PATENT DOCUMENTS

| | | | |
|---|---|---|---|
| 7,719,054 B2 * | 5/2010 | Williams et al. ............... 257/335 |
| 8,217,419 B2 | 7/2012 | Takaishi | |
| 8,637,952 B2 | 1/2014 | Yamaura | |
| 8,729,605 B2 | 5/2014 | Takaishi | |
| 2009/0294891 A1 * | 12/2009 | Niwa ............................ 257/488 |
| 2010/0244194 A1 * | 9/2010 | Masada et al. ................. 257/605 |
| 2012/0074522 A1 | 3/2012 | Zhang et al. | |
| 2012/0119318 A1 * | 5/2012 | Tokura et al. .................. 257/489 |
| 2012/0139079 A1 * | 6/2012 | Tokura et al. .................. 257/471 |
| 2013/0119394 A1 * | 5/2013 | Zhu et al. ......................... 257/76 |
| 2013/0189832 A1 | 7/2013 | Masada et al. | |

FOREIGN PATENT DOCUMENTS

| | | |
|---|---|---|
| JP | A-06-334200 | 12/1994 |
| JP | A-08-064843 | 3/1996 |
| JP | A-2009-004501 | 1/2009 |
| JP | A-2010-239015 | 10/2010 |
| JP | A-2010-239016 | 10/2010 |
| JP | A-2011-233772 | 11/2011 |
| JP | A-2012-182381 | 9/2012 |

* cited by examiner

Primary Examiner — Peter Bradford
(74) Attorney, Agent, or Firm — Oliff PLC

(57) ABSTRACT

A semiconductor device including field insulating films and having first corner portions, provided on a P-type epitaxial growth layer; an $N^-$-type cathode that is provided in the P-type epitaxial growth layer and is located on the inner sides of the field insulating films; and a $P^-$-type anode that is formed on the cathode so as to be in contact with the cathode and covers the first corner portions provided on the inner sides of the field insulating films, wherein the junction between the cathode and the anode serves as a PN junction of the diode, and the PN junction is spaced apart from the first corner portions.

15 Claims, 4 Drawing Sheets

FIG. 5A
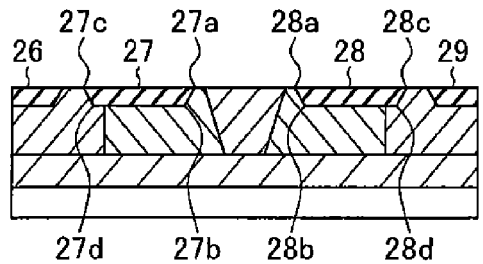
FIG. 5B
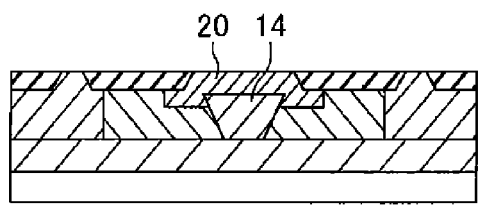
FIG. 5C
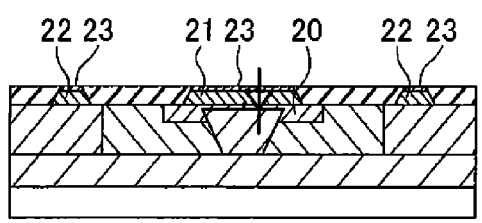
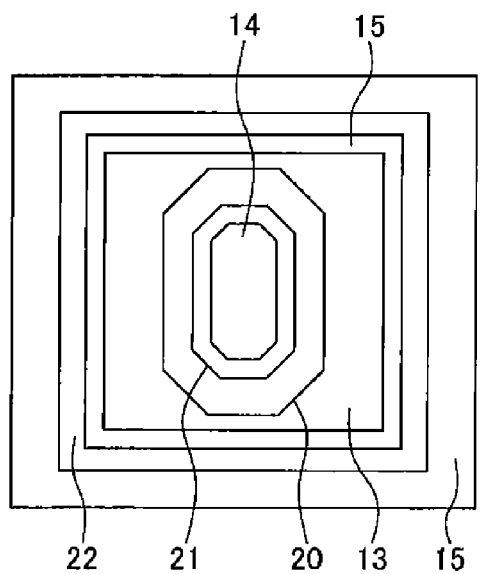
FIG. 6

SEMICONDUCTOR DEVICE WHICH SUPPRESSES FLUCTUATIONS IN BREAKDOWN VOLTAGE

CROSS REFERENCE

The entire disclosure of Japanese Patent Application No. 2013-229972, filed Nov. 6, 2013, is expressly incorporated by reference herein.

BACKGROUND

1. Technical Field

The present invention relates to a semiconductor device including a diode.

2. Related Art

FIG. 7 is a cross-sectional view of a semiconductor device according to a related art. A vertical zener diode included in the semiconductor device is disclosed in US 2012/0074522 (FIG. 2).

The semiconductor device shown in FIG. 7 includes a silicon substrate 111, and an N-type buried layer 112 provided on the silicon substrate 111. A P-type epitaxial growth layer 113 is provided on the N-type buried layer 112, and field insulating films 116, 117, 118 and 119 made of LOCOS oxide films are provided on the P-type epitaxial growth layer 113.

A cathode 114 composed of an $N^-$-type impurity region is provided in the P-type epitaxial growth layer 113 that is on the inner sides of the field insulating films 117 and 118, and the $N^-$-type cathode 114 is electrically connected to the N-type buried layer 112. An anode 121 composed of a $P^+$-type impurity region is provided on the cathode 114 provided in the P-type epitaxial growth layer 113 that is on the inner sides of the field insulating films 117 and 118. A PN junction of the zener diode is provided by the $P^+$-type anode 121 and the cathode 114.

$N^+$-type impurity regions 122 are provided respectively on the P-type epitaxial growth layer 113 at a position that is on the outer side of the field insulating film 117 and is on the inner side of a field insulating film 116, and on the P-type epitaxial growth layer 113 at a position that is on the outer side of the field insulating film 118 and is on the inner side of a field insulating film 119. In the P-type epitaxial growth layer 113, $N^-$-type impurity regions 115 located under the $N^+$-type impurity regions 122 are provided, and the $N^-$-type impurity regions 115 are electrically connected to the N-type buried layer 112. A silicide film 123 is provided on the $N^+$-type impurity regions 122 and the anode 121.

The above-described diode is problematic in that the breakdown voltage fluctuates if the diode is repeatedly used.

SUMMARY

An advantage of some aspects of the invention is to provide a semiconductor device including a diode that suppresses fluctuations in the breakdown voltage.

An aspect of the invention relates to a semiconductor device including: a field insulating film having a first corner portion, provided on a semiconductor layer; a first impurity region of first conductivity type that is provided in the semiconductor layer and is located on an inner side of the field insulating film; and a second impurity region of second conductivity type that is provided on the first impurity region so as to be in contact with the first impurity region and covers the first corner portion provided on the inner side of the field insulating film, wherein a junction between the first impurity region and the second impurity region serves as a PN junction of a diode, and the PN junction is spaced apart from the first corner portion.

According to this aspect of the invention, the first corner portion provided on the inner side of the field insulating film is covered with the second impurity region, and the PN junction where the second impurity region and the first impurity region are connected is disposed so as to be apart from the first corner portion. With this configuration, it is possible to suppress the occurrence of electric field concentration in the first corner portion of the field insulating film. Accordingly, fluctuations in the breakdown voltage can be suppressed even if the diode is repeatedly used.

The term "semiconductor layer" used in this specification may be an epitaxial layer, a silicon substrate, or an impurity diffusion layer provided on the epitaxial layer or the silicon substrate.

Also, according to the above-described aspect of the invention, it is preferable that the second impurity region is provided below the field insulating film, and the first impurity region is not provided below the field insulating film. With this configuration, it is possible to suppress the occurrence of electric field concentration in the first corner portion of the field insulating film.

Also, according to the above-described aspect of the invention, it is preferable that the PN junction is not provided below the field insulating film. With this configuration, it is possible to suppress the occurrence of electric field concentration in the first corner portion of the field insulating film.

Also, according to the above-described aspect of the invention, it is preferable that the PN junction is surrounded by the field insulating film. With this configuration, it is possible to suppress the occurrence of electric field concentration in the first corner portion of the field insulating film.

Also, according to the above-described aspect of the invention, it is preferable that the semiconductor device includes: a third impurity region of first conductivity type that is provided in the semiconductor layer and is provided on an outer side of the field insulating film; and a fourth impurity region of first conductivity type that is provided under the semiconductor layer and is connected to the third impurity region and the first impurity region.

Also, according to the above-described aspect of the invention, it is preferable that the field insulating film includes a second corner portion, and the third impurity region covers the second corner portion that is provided on the outer side of the field insulating film. With this configuration, it is possible to suppress the occurrence of electric field concentration in the second corner portion of the field insulating film.

Also, according to the above-described aspect of the invention, it is preferable that the second impurity region includes a first region that covers the PN junction and a second region that is located on the first region, the second region having a higher impurity concentration than the first region, and the third impurity region includes a third region connected to the fourth impurity region and a fourth region that is located on the third region, the fourth region having a higher impurity concentration than the third region.

Also, according to the above-described aspect of the invention, it is preferable that an inner perimeter of the field insulating film has a planar shape that is the shape of a rectangle whose corners have been removed. With this configuration, it is possible to suppress the occurrence of electric field concentration in the field insulating film.

Also, according to the above-described aspect of the invention, it is preferable that the field insulating film is a LOCOS oxide film or a trench oxide film.

Another aspect of the invention relates to a semiconductor device including: a field insulating film provided on a semiconductor layer; a first impurity region of first conductivity type that is provided in the semiconductor layer and is located on an inner side of the field insulating film; and a second impurity region of second conductivity type that is provided on the first impurity region so as to be in contact with the first impurity region and to be in contact with the field insulating film, wherein a junction between the first impurity region and the second impurity region serves as a PN junction of a diode, and the PN junction is spaced apart from a boundary between the field insulating film and the second impurity region.

According to this aspect of the invention, the PN junction where the second impurity region and the first impurity region are connected is disposed so as to be apart from the boundary between the field insulating film and the second impurity region. With this configuration, it is possible to suppress the occurrence of electric field concentration in the boundary between the field insulating film and the second impurity region. Accordingly, fluctuations in the breakdown voltage can be suppressed even if the diode is repeatedly used.

BRIEF DESCRIPTION OF THE DRAWINGS

The invention will be described with reference to the accompanying drawings, wherein like numbers reference like elements.

FIGS. 5A to 5C are cross-sectional views illustrating the method for manufacturing a semiconductor device according to the aspect of the invention.

FIG. 6 is a plan view of the semiconductor device shown in FIG. 5C.

DESCRIPTION OF EXEMPLARY EMBODIMENTS

Hereinafter, embodiments of the invention will be described in detail with reference to the drawings. It is to be noted that the invention is not limited to the description given below, and those skilled in the art readily appreciate that the embodiments and details thereof can be changed in various ways without departing from the spirit and scope of the invention. Accordingly, the invention should not be construed as limited to the description of the embodiments given below. The term "corner portion" used in this specification refers to a portion having a small radius of curvature, specifically, a portion having a radius of curvature of 0.5 μm or less.

Embodiment 1

Figure 1A:
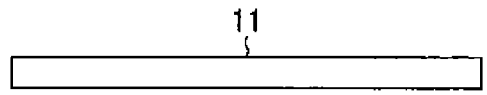
FIGS. 1A to 1D are cross-sectional views illustrating a method for manufacturing a semiconductor device according to an aspect of the invention.
Figure 1B:
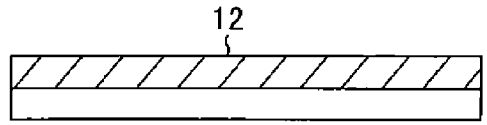
Figure 1C:
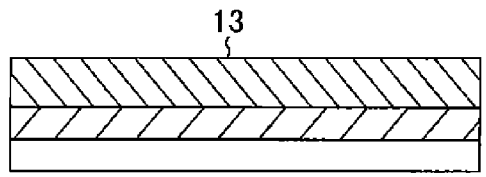
Figure 1D:
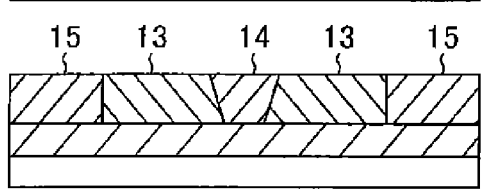
Figure 2A:
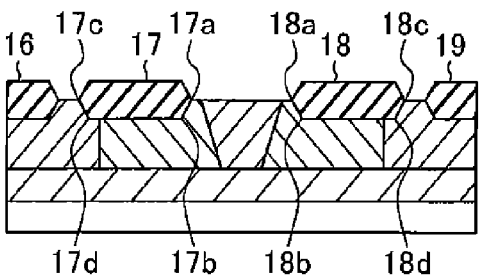
FIGS. 2A to 2C are cross-sectional views illustrating the method for manufacturing a semiconductor device according to the aspect of the invention.
Figure 2B:
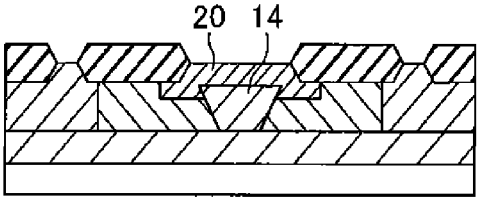
Figure 2C:
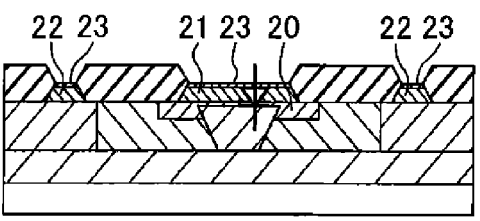
Figure 3:
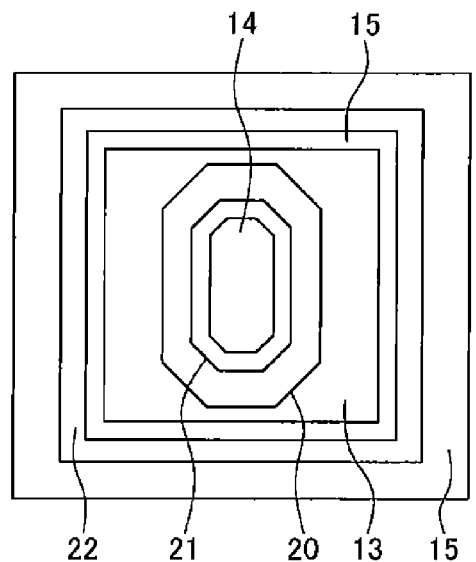
FIG. 3 is a plan view of the semiconductor device shown in FIG. 2C.
Figure 4A:
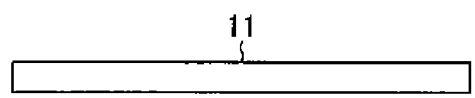
FIGS. 4A to 4D are cross-sectional views illustrating a method for manufacturing a semiconductor device according to an aspect of the invention.
Figure 4B:
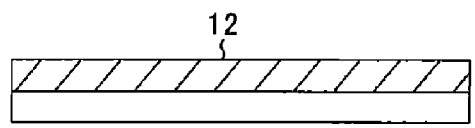
Figure 4C:
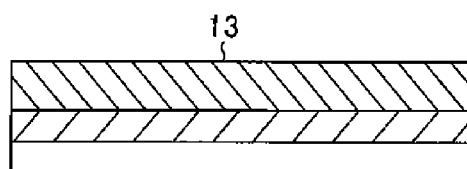
Figure 4D:
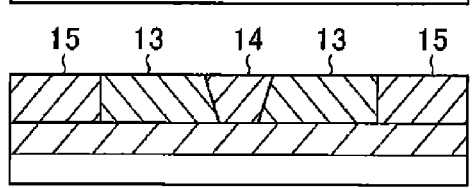
Figure 7:
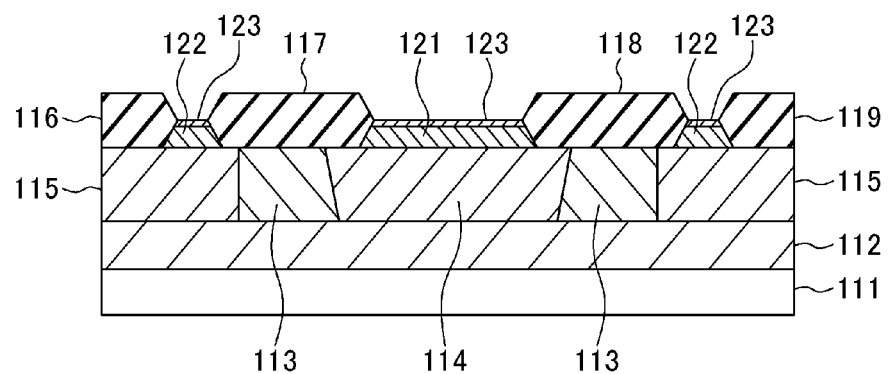
FIG. 7 is a cross-sectional view of a semiconductor device according to a related art.

FIGS. 1 and 2 are cross-sectional views illustrating a method for manufacturing a semiconductor device according to an aspect of the invention. FIG. 3 is a plan view of the semiconductor device shown in FIG. 2C.

As shown in FIG. 1A, a silicon substrate 11 is prepared. Next, as shown in FIG. 1B, an N-type buried layer 12 (also referred to as a "fourth impurity region") is provided on the silicon substrate 11. Next, as shown in FIG. 1C, a P-type epitaxial growth layer 13 is provided on the N-type buried layer 12.

Next, as shown in FIG. 1D, in the P-type epitaxial growth layer 13, a cathode 14 composed of an $N^-$-type impurity region (also referred to as a "first impurity region") and $N^-$-type third impurity regions 15 are provided. The cathode 14 and the third impurity regions 15 are located on the N-type buried layer 12, and they are electrically connected to the N-type buried layer 12. The $N^-$ type cathode 14 has a planar shape that is the shape of a rectangle whose corners have been removed (see FIG. 3).

Next, as shown in FIG. 2A, field insulating films 16, 17, 18 and 19 composed of LOCOS oxide films are provided on the P-type epitaxial growth layer 13.

An active region is provided on the inner sides of the field insulating films 17 and 18, and the cathode 14 is provided in the active region. First corner portions 17a, 17b, 18a and 18b are provided on the inner sides of the field insulating films 17 and 18, and second corner portions 17c, 17d, 18c and 18d are provided on the outer sides of the field insulating films 17 and 18. The first corner portions 17a, 17b, 18a and 18b provided on the inner sides of the field insulating films 17 and 18 are spaced apart from the cathode 14, and thus are not covered with the cathode 14. The second corner portions 17c, 17d, 18c and 18d provided on the outer sides of the field insulating films 17 and 18 are covered with the third impurity region 15.

Next, as shown in FIG. 2B, in the P-type epitaxial growth layer 13 provided on the inner sides of the field insulating films 17 and 18, an anode 20 composed of a P-type impurity region (also referred to as a "second impurity region") is provided that is located on the cathode 14 and is in contact with the cathode 14. The anode 20, which is a $P^-$-type layer that determines the breakdown voltage of the zener diode, is provided so as to extend under the field insulating films 17 and 18 by ion implantation of high acceleration energy while overlapping the active region. In other words, the $P^-$-type anode 20 is disposed so as to extend toward the outside of the active region, and the $N^-$-type cathode 14 is disposed immediately under the active region.

The anode 20 covers the first corner portions 17a, 17b, 18a and 18b provided on the inner sides of the field insulating films 17 and 18. The junction between the $P^-$-type anode 20 and the $N^-$-type cathode 14 serves as a PN junction of the zener diode. The PN junction is spaced apart from the first corner portions 17a, 17b, 18a and 18b. Also, the PN junction is located inwardly of a lower portion of the anode 20. The PN junction is not provided below the field insulating films 17 and 18. The PN junction is surrounded by the field insulating films 17 and 18. The $P^-$-type anode 20 is also provided below the field insulating films 17 and 18. The $N^-$-type cathode 14 is not provided below the field insulating films 17 and 18. The anode 20 has a planar shape that is the shape of a rectangle whose corners have been removed (see FIG. 3).

Next, as shown in FIG. 2C, an anode 21 composed of a $P^+$-type impurity region is provided on the $P^-$-type anode 20 provided on the inner sides of the field insulating films 17 and 18. Next, $N^+$-type impurity regions 22 are provided respectively on the $N^-$-type third impurity region 15 at a position that is on the outer side of the field insulating film 17 and is on the inner side of the field insulating film 16, and on the $N^-$-type third impurity region 15 at a position that is on the outer side of the field insulating film 18 and is on the inner side of the field insulating film 19. Next, a silicide film 23 is provided on the $N^+$-type impurity regions 22 and the $P^+$-type anode 21 as a cathode electrode or an anode electrode.

The P⁻-type anode 20 and the P⁺-type anode 21 may also be expressed as follows. The P⁻-type anode 20 includes the first region 20 that covers the PN junction and the second region 21 located on the first region 20, and the second region 21 has a higher impurity concentration than the first region 20.

The N⁻-type third impurity region 15 and the N⁺-type impurity region 22 may also be expressed as follows. The third impurity region 15 includes the third region 15 electrically connected to the N-type buried layer 12 and the fourth region 22 located on the third region 15, and the fourth region 22 has a higher impurity concentration than the third region 15. The anode 21 has a planar shape that is the shape of a rectangle whose corners have been removed (see FIG. 3). Likewise, the inner perimeters of the field insulating films 17 and 18 have a planar shape that is the shape of a rectangle whose corners have been removed.

According to the present embodiment, the first corner portions 17a, 17b, 18a and 18b provided on the inner sides of the field insulating films 17 and 18 are covered with the P⁻-type anode 20, and the PN junction where the anode 20 and the cathode 14 are connected is disposed so as to be apart from the first corner portions 17a, 17b, 18a and 18b. Accordingly, it is possible to suppress the occurrence of electric field concentration in the first corner portions 17a, 17b, 18a and 18b of the field insulating films 17 and 18. Also, the PN junction is disposed so as to be apart from the boundaries between the field insulating films 17 and 18 and the P⁻-type anode 20. With this configuration, it is possible to suppress a situation in which electric fields are concentrated to the boundaries between the field insulating films 17 and 18 and the P⁻-type anode 20. Accordingly, it is possible to provide a diode that can suppress fluctuations in the breakdown voltage even if the diode is repeatedly used and that has stable breakdown voltage characteristics.

Also, by covering the second corner portions 17c, 17d, 18c and 18d provided on the outer sides of the field insulating films 17 and 18 with the third impurity region 15, the occurrence of electric field concentration in the second corner portions of the field insulating films can be suppressed.

Also, by forming the inner perimeters of the field insulating films 17 and 18 to have a planar shape that is the shape of a rectangle whose corners have been removed, the occurrence of electric field concentration in the field insulating films 17 and 18 can be suppressed. Accordingly, fluctuations in the breakdown voltage can be suppressed even if the diode is repeatedly used.

Also, the semiconductor device of the present embodiment can be manufactured at a low cost.

The polarity of each constituent element of the semiconductor device according to the present embodiment may be reversed.

Embodiment 2

FIGS. 4 and 5 are cross-sectional views illustrating a method for manufacturing a semiconductor device according to an embodiment of the invention. FIG. 6 is a plan view of the semiconductor device shown in FIG. 5C.

The steps shown in FIGS. 4A to 4D are the same as those shown in FIGS. 1A to 1D.

Next, as shown in FIG. 5A, field insulating films 26, 27, 28 and 29 composed of trench oxide films are provided in the P-type epitaxial growth layer 13. The term "trench oxide film" used in this specification refers to an oxide film provided within a trench. For example, the field insulating films 26 and 29 may be shallow trench isolation (STI) films. The field insulating films 26, 27, 28 and 29 may be formed simultaneously.

An active region is provided on the inner sides of the field insulating films 27 and 28, and a cathode 14 is provided in the active region. First corner portions 27a, 27b, 28a and 28b are provided on the inner sides of the field insulating films 27 and 28, and second corner portions 27c, 27d, 28c and 28d are provided on the outer sides of the field insulating films 27 and 28. The first corner portions 27a, 27b, 28a and 28b provided on the inner sides of the field insulating films 27 and 28 are spaced apart from the cathode 14, and thus are not covered with the cathode 14. The second corner portions 27c, 27d, 28c and 28d provided on the outer sides of the field insulating films 27 and 28 are covered with the third impurity region 15.

Next, as shown in FIG. 5B, on the P-type epitaxial growth layer 13 provided on the inner sides of the field insulating films 27 and 28, an anode 20 composed of a P⁻-type impurity region (also referred to as a "second impurity region") is provided that is located on the cathode 14 and is in contact with the cathode 14. The anode 20, which is a P⁻-type layer that determines the breakdown voltage of the zener diode, is provided so as to extend under the field insulating films 27 and 28 by ion implantation of high acceleration energy while overlapping the active region.

The anode 20 covers the first corner portions 27a, 27b, 28a and 28b provided on the inner sides of the field insulating films 27 and 28. The junction between the P⁻-type anode 20 and the N⁻-type cathode 14 serves as a PN junction of the zener diode. The PN junction is spaced apart from the first corner portions 27a, 27b, 28a and 28b.

Next, as shown in FIG. 5C, an anode 21 composed of a P⁺-type impurity region is provided on the P⁻-type anode 20 provided on the inner sides of the field insulating films 27 and 28. Next, N⁺-type impurity regions 22 are provided respectively on the N⁻-type third impurity region 15 at a position that is on the outer side of the field insulating film 27 and is on the inner side of the field insulating film 26, and on the N⁻-type third impurity region 15 at a position that is on the outer side of the field insulating film 28 and is on the inner side of the field insulating film 29. Next, a silicide film 23 is provided on the N⁺-type impurity regions 22 and the P⁺-type anode 21. The inner perimeters of the field insulating films 27 and 28 have a planar shape that is the shape of a rectangle whose corners have been removed.

According to the present embodiment, the first corner portions 27a, 27b, 28a and 28b provided on the inner sides of the field insulating films 27 and 28 are covered with the P⁻-type anode 20, and the PN junction where the anode 20 and the cathode 14 are connected is disposed so as to be apart from the first corner portions 27a, 27b, 28a and 28b. Accordingly, it is possible to suppress the occurrence of electric field concentration in the first corner portions 27a, 27b, 28a and 28b of the field insulating films 27 and 28. Also, the PN junction is disposed so as to be apart from the boundaries between the field insulating films 27 and 28 and the P⁻-type anode 20. Accordingly, it is possible to suppress a situation in which electric fields are concentrated to the boundaries between the field insulating films 27 and 28 and the P⁻-type anode 20. Accordingly, it is possible to provide a diode that can suppress fluctuations in the breakdown voltage even if the diode is repeatedly used and that has stable breakdown voltage characteristics.

Also, by covering the second corner portions 27c, 27d, 28c and 28d provided on the outer sides of the field insulating films 27 and 28 with the third impurity region 15, the occurrence of electric field concentration in the second corner portions of the field insulating films can be suppressed.

Also, by forming the inner perimeters of the field insulating films 27 and 28 to have a planar shape that is the shape of a rectangle whose corners have been removed, the occurrence of electric field concentration in the field insulating films 27 and 28 can be suppressed. Accordingly, fluctuations in the breakdown voltage can be suppressed even if the diode is repeatedly used.

Also, the semiconductor device of the present embodiment can be manufactured at a low cost.

The polarity of each constituent element of the semiconductor device according to the present embodiment may be reversed.

Note that in the invention, the expression "a particular element B (hereinafter referred to as 'element B') is provided (or located) on (or under) a particular element A (hereinafter referred to as 'element A')" is not limited to the case where the element B is provided (or located) directly on (or under) the element A. The above expression also encompasses the case where the element B is provided (or located) on (or under) the element A with another element interposed therebetween as long as the actions and effects of the invention are not impaired.

What is claimed is:

1. A semiconductor device comprising:
    a semiconductor layer;
    a field insulating film having a first corner portion, the field insulating film provided on the semiconductor layer;
    a first impurity region of a first conductivity type that is provided in the semiconductor layer, the first impurity region located on an inner side of the field insulating film;
    a second impurity region of a second conductivity type that is provided on the first impurity region so as to be in contact with the first impurity region, the second impurity region covering the first corner portion provided on the inner side of the field insulating film;
    a third impurity region of the first conductivity type that is provided in the semiconductor layer, the third impurity region provided on an outer side of the field insulating film; and
    a fourth impurity region of the first conductivity type that is provided under the semiconductor layer, the fourth impurity region connected to the third impurity region and the first impurity region,
    a junction between the first impurity region and the second impurity region being a PN junction of a diode,
    the PN junction being spaced apart from the first corner portion,
    the second impurity region including a first region that covers the PN junction and a second region that is located on the first region, the second region having a higher impurity concentration than the first region, and
    the third impurity region including a third region connected to the fourth impurity region and a fourth region that is located on the third region, the fourth region having a higher impurity concentration than the third region.

2. The semiconductor device according to claim 1, wherein the PN junction is located inwardly of a lower portion of the second impurity region.

3. The semiconductor device according to claim 1, wherein the second impurity region is provided below the field insulating film, and
    the first impurity region is not provided below the field insulating film.

4. The semiconductor device according to claim 1, wherein the PN junction is not provided below the field insulating film.

5. The semiconductor device according to claim 1, wherein the PN junction is surrounded by the field insulating film.

6. The semiconductor device according to claim 1, wherein the field insulating film includes a second corner portion, and
    the third impurity region covers the second corner portion that is provided on the outer side of the field insulating film.

7. The semiconductor device according to claim 1, wherein an inner perimeter of the field insulating film has a planar shape that is a shape of a rectangle whose corners have been removed.

8. The semiconductor device according to claim 1, wherein the field insulating film is a LOCOS oxide film or a trench oxide film.

9. A semiconductor device comprising:
    a semiconductor layer;
    a field insulating film provided on the semiconductor layer;
    a first impurity region of a first conductivity type that is provided in the semiconductor layer, the first impurity region located on an inner side of the field insulating film;
    a second impurity region of a second conductivity type that is provided on the first impurity region so as to be in contact with the first impurity region and to be in contact with the field insulating film;
    a third impurity region of the first conductivity type that is provided in the semiconductor layer, the third impurity region provided on an outer side of the field insulating film; and
    a fourth impurity region of the first conductivity type that is provided under the semiconductor layer, the fourth impurity region connected to the third impurity region and the first impurity region,
    a junction between the first impurity region and the second impurity region being a PN junction of a diode,
    the PN junction being spaced apart from a boundary between the field insulating film and the second impurity region,
    the second impurity region including a first region that covers the PN junction and a second region that is located on the first region, the second region having a higher impurity concentration than the first region, and
    the third impurity region including a third region connected to the fourth impurity region and a fourth region that is located on the third region, the fourth region having a higher impurity concentration than the third region.

10. The semiconductor device according to claim 9, wherein
    the PN junction is located inwardly of a lower portion of the second impurity region.

11. The semiconductor device according to claim 9, wherein
    the second impurity region is provided below the field insulating film, and
    the first impurity region is not provided below the field insulating film.

12. The semiconductor device according to claim 9, wherein
    the PN junction is not provided below the field insulating film.

13. The semiconductor device according to claim 9, wherein
    the PN junction is surrounded by the field insulating film.

14. The semiconductor device according to claim 9, wherein
    an inner perimeter of the field insulating film has a planar shape that is a shape of a rectangle whose corners have been removed.

15. The semiconductor device according to claim 9, wherein
the field insulating film is a LOCOS oxide film or a trench oxide film.

* * * * *